(12) United States Patent
Connell

(10) Patent No.: US 10,535,331 B2
(45) Date of Patent: Jan. 14, 2020

(54) SYSTEM, APPARATUS AND METHODS FOR MUSICAL INSTRUMENT AMPLIFIER

(71) Applicant: James Connell, Louisville, CO (US)

(72) Inventor: James Connell, Louisville, CO (US)

( * ) Notice: Subject to any disclaimer, the term of this patent is extended or adjusted under 35 U.S.C. 154(b) by 0 days.

(21) Appl. No.: 15/972,539

(22) Filed: May 7, 2018

(65) Prior Publication Data
US 2018/0277084 A1   Sep. 27, 2018

Related U.S. Application Data

(63) Continuation-in-part of application No. 15/573,761, filed as application No. PCT/US2016/032619 on May 15, 2016.

(60) Provisional application No. 62/502,469, filed on May 5, 2017, provisional application No. 62/162,565, filed on May 15, 2015.

(51) Int. Cl.
| | | |
|---|---|---|
| *G10H 1/46* | (2006.01) | |
| *G10H 3/18* | (2006.01) | |
| *G10H 1/02* | (2006.01) | |
| *H03G 5/02* | (2006.01) | |
| *H03F 3/183* | (2006.01) | |
| *H03G 5/16* | (2006.01) | |
| *G10H 1/08* | (2006.01) | |
| *H03G 3/30* | (2006.01) | |

(52) U.S. Cl.
CPC ............. *G10H 1/46* (2013.01); *G10H 1/02* (2013.01); *G10H 1/08* (2013.01); *G10H 3/181* (2013.01); *G10H 3/185* (2013.01); *G10H 3/186* (2013.01); *H03F 3/183* (2013.01); *H03G 5/02* (2013.01); *H03G 5/165* (2013.01); *G10H 2220/465* (2013.01); *G10H 2230/075* (2013.01); *H03F 2200/03* (2013.01); *H03G 3/3005* (2013.01)

(58) Field of Classification Search
CPC .......... G10H 3/181; G10H 1/46; G10H 3/183; G10H 3/186
USPC .......................................................... 84/743
See application file for complete search history.

(56) References Cited

U.S. PATENT DOCUMENTS

| | | | | |
|---|---|---|---|---|
| 1,861,717 A | * | 6/1932 | Pfeil ...................... | G10D 1/02 84/727 |
| 2,130,174 A | * | 9/1938 | Beauchamp ........... | G10H 3/181 84/727 |

(Continued)

*Primary Examiner* — David S Warren
*Assistant Examiner* — Christina M Schreiber
(74) *Attorney, Agent, or Firm* — J. Curtis Edmondson; Law Offices of J. Curtis Edmondson

(57) ABSTRACT

An onboard electronic system and associated method enables a player of an acoustic stringed instrument to control an electronic signal for modifying and amplifying sound while playing an instrument. The onboard electronic system is embedded in the tailpiece and/or the chinrest portions and/or shoulder-rest portion of the stringed instrument, and includes at least one pickup, a battery-powered amplification unit and at least one controller. The method includes steps for controlling sound amplification and tonal modification onboard an acoustic stringed instrument. The steps include sensing vibration from strings with a pickup, generating an electrical signal and transmitting the electrical signal to an amplification unit via an input cable, and modifying the electrical signal in response to one or more controllers located onboard the instrument.

8 Claims, 15 Drawing Sheets

(56) References Cited

U.S. PATENT DOCUMENTS

| | | | | |
|---|---|---|---|---|
| 2,310,199 A * | 2/1943 | Beauchamp | G10H 3/18 | 84/723 |
| 3,003,382 A * | 10/1961 | Fender | G10H 3/185 | 84/727 |
| 4,719,835 A * | 1/1988 | Biasini | G10D 3/18 | 84/279 |
| 4,765,219 A * | 8/1988 | Alm | G10D 1/02 | 224/910 |
| 5,191,159 A * | 3/1993 | Jordan | G10D 1/02 | 84/274 |
| 5,194,686 A * | 3/1993 | Winkler | G10D 3/12 | 84/743 |
| D338,222 S * | 8/1993 | Steinberger | | 84/278 |
| 5,321,201 A * | 6/1994 | Noreen | G10H 3/182 | 84/312 P |
| 5,929,362 A * | 7/1999 | Oteyza | G10D 1/085 | 84/293 |
| 6,222,110 B1 * | 4/2001 | Curtis | G10H 1/125 | 84/735 |
| 6,288,320 B1 * | 9/2001 | Murakami | G10H 1/342 | 84/600 |
| 6,680,431 B2 * | 1/2004 | Vanden | G10D 3/18 | 84/278 |
| 7,304,232 B1 * | 12/2007 | Nicholes | G10H 1/46 | 84/741 |
| 7,531,727 B2 * | 5/2009 | Buttemer | G10D 3/18 | 84/278 |
| 9,502,016 B2 * | 11/2016 | Balatti | G10D 3/18 | |
| 2004/0159225 A1 * | 8/2004 | Barr | G10H 1/32 | 84/743 |
| 2007/0084335 A1 * | 4/2007 | Silzel | G10H 3/143 | 84/723 |
| 2017/0316770 A1 * | 11/2017 | Palavratzis | G10D 1/06 | |
| 2018/0130453 A1 * | 5/2018 | Connell | G10H 3/181 | |
| 2018/0277084 A1 * | 9/2018 | Connell | G10H 1/46 | |

* cited by examiner

SYSTEM, APPARATUS AND METHODS FOR MUSICAL INSTRUMENT AMPLIFIER

CROSS REFERENCE TO RELATED APPLICATIONS

This application claims benefit of U.S. Provisional Patent Application No. 62/502,469 filed on May 5, 2017, which is incorporated herein by reference in its entirety and is a continuation-in-part of U.S. Nonprovisional application Ser. No. 15/573,761 filed on Nov. 13, 2017, which is a national stage application of international application No. PCT/US16/32619, filed on May 15, 2016, entitled as "Apparatus and Methods for an Electronic Stringed Musical Instrument", which claims the benefit of U.S. Provisional Patent Application No. 62/162,565 filed on May 15, 2015, which is incorporated herein by reference in its entirety.

FIELD

The inventive subject matter relates to the amplification and control of sound from musical instruments and specifically to the apparatus and methods for fine tuning control, amplification and modification of sound from a stringed musical instrument.

BACKGROUND

Musical instruments of the string family have long been noted for the tonal beauty and intimate quality of their music. These instruments produce musical tones with a resonator or tone chamber that is energized by the vibrations of the oscillating strings.

With the present-day advent of electronics, various attempts have been made to produce stringed instruments having improved tonal characteristics and higher levels of sound intensity. A conventional electromechanical or electromagnetic sound transducer, used in conjunction with a vacuum tube amplifier and loudspeaker, is capable of giving any level of sound intensity desired, but the tonal quality of such instruments may be compromised in the process.

The beautiful tones which emanate from the stringed instruments are the result of string vibrations plus the modulation and added overtones introduced by the resonator. So, it is desirous to provide a system capable of modifying and introducing certain characteristics into the electrical output from the vibrating strings, or capable of modifying, in a predetermined manner, the energy produced by the loudspeaker, or capable of doing both. Accordingly, it is an object of this inventive subject matter to provide an apparatus and methods for fine tuning control of stringed musical instruments.

It has long been desired for guitarists and other stringed instrumentalists to play instruments that maintain their pitch over a long period of time, and preferably over the entire lifetime of the string. On the other hand, any automatic tuning device should not affect the purity, richness, tone, and crispness of the sound of the instrument, which can degrade if an active electromechanical device is connected to the strings. Several examples of tuning devices for stringed instruments have been described in the prior art.

U.S. Pat. No. 3,080,785 issued to Evans describes an electro tone modifying systems for stringed musical instruments.

U.S. Pat. No. 5,191,159 issued to Jordan describes an electrical stringed musical instrument.

U.S. Pat. No. 4,313,362 issued to Lieber describes an electric guitar with plastic construction.

U.S. Pat. No. 4,928,563 issued to Mirata describes an electronic tuning apparatus for an electronic stringed musical instrument.

U.S. Pat. No. 5,052,269 issued to Young Jr describes an -electric guitar with interior neck extension.

U.S. Pat. No. 5,095,797 issued to Zacaroli describes an automatic tone control for stringed musical instruments.

U.S. Pat. No. 6,680,431 issued to Vanden et al. describes a violin shoulder rest configured to mount a positionable microphone and to accommodate one or more electrical signal inputs.

Accordingly, there remains a continual need for improved apparatus and methods for a fine-tuning control, amplification and modification of sound from stringed musical instruments. Additionally, it would be desirous if the fine-tuning control can be achieved synchronously with the playing of the stringed musical instrument. It is to these and other improvements that preferred embodiments of the present inventive subject matter are generally directed.

SUMMARY

The present inventive subject matter describes an assemblage of a tail piece and an adjustable chin rest embedded with electronic circuitry with a control unit into a stringed musical instrument to achieve a synchronous fine control of the pitch, tone, amplitude and the like defining melodious audible music while the instrument is being played.

In one embodiment, an onboard electronic system for amplification and tonal modification of sound from an acoustic stringed instrument is provided. The onboard electronic system includes a tailpiece and bridge for supporting at least one string of an acoustic instrument and at least one pickup to sense vibration of the string and to generate an electrical signal of the vibration. The system further includes a battery-powered amplification unit attached to the tailpiece and electrically coupled to the pickup for amplifying the electrical signal, and at least one controller for modifying the electrical signal via the amplification unit.

In another embodiment, a tailpiece for housing an onboard electronic system for an acoustic stringed instrument is provided. The tailpiece includes an amplification unit attached to the tailpiece for amplifying and modifying an electrical signal of sound from a string of the instrument, an input cable for coupling the electrical signal to the amplification unit from a pickup, and a battery attached to the tailpiece to supply electrical power to the amplification unit. The tailpiece further includes at least one controller attached to the tailpiece for amplifying and modifying the electrical signal.

In yet another embodiment, a tailpiece section and a chinrest section for housing an onboard electronic system for an acoustic stringed instrument is provided. The tailpiece and the chinrest sections include an amplification unit for amplifying and modifying an electrical signal of sound from a string of the instrument, an input cable for coupling the electrical signal to the amplification unit from a pickup, and a battery to supply electrical power to the amplification unit. The tailpiece and the chinrest sections further includes at least one controller for amplifying and modifying the electrical signal.

In still another embodiment, a tailpiece section and a shoulder-rest section for housing an onboard electronic system for an acoustic stringed instrument is provided. The shoulder-rest sections include an amplification unit for amplifying and modifying an electrical signal of sound from a string of the instrument, an input cable for coupling the electrical signal to the amplification unit from a pickup, and a battery to supply electrical power to the amplification unit. The tailpiece and the shouldr-rest sections further includes at least one controller for amplifying and modifying the electrical signal.

In further yet another embodiment, a method for controlling sound amplification and tonal modification onboard an acoustic stringed instrument is provided. The method includes sensing vibration from at least one string with a pickup onboard the instrument, generating an electrical signal and transmitting the electrical signal to an amplification unit (in the chin rest portion or the shoulder-rest portion) via an input cable, amplifying and modifying the electrical signal in response to one or more controllers located onboard the instrument.

These and other embodiments are described in more detail in the following detailed descriptions and the figures. The foregoing is not intended to be an exhaustive list of embodiments and features of the present inventive subject matter. Persons skilled in the art are capable of appreciating other embodiments and features from the following detailed description in conjunction with the drawings.

LIST OF SELECTED REFERENCE CHARACTERS

Figure 1:
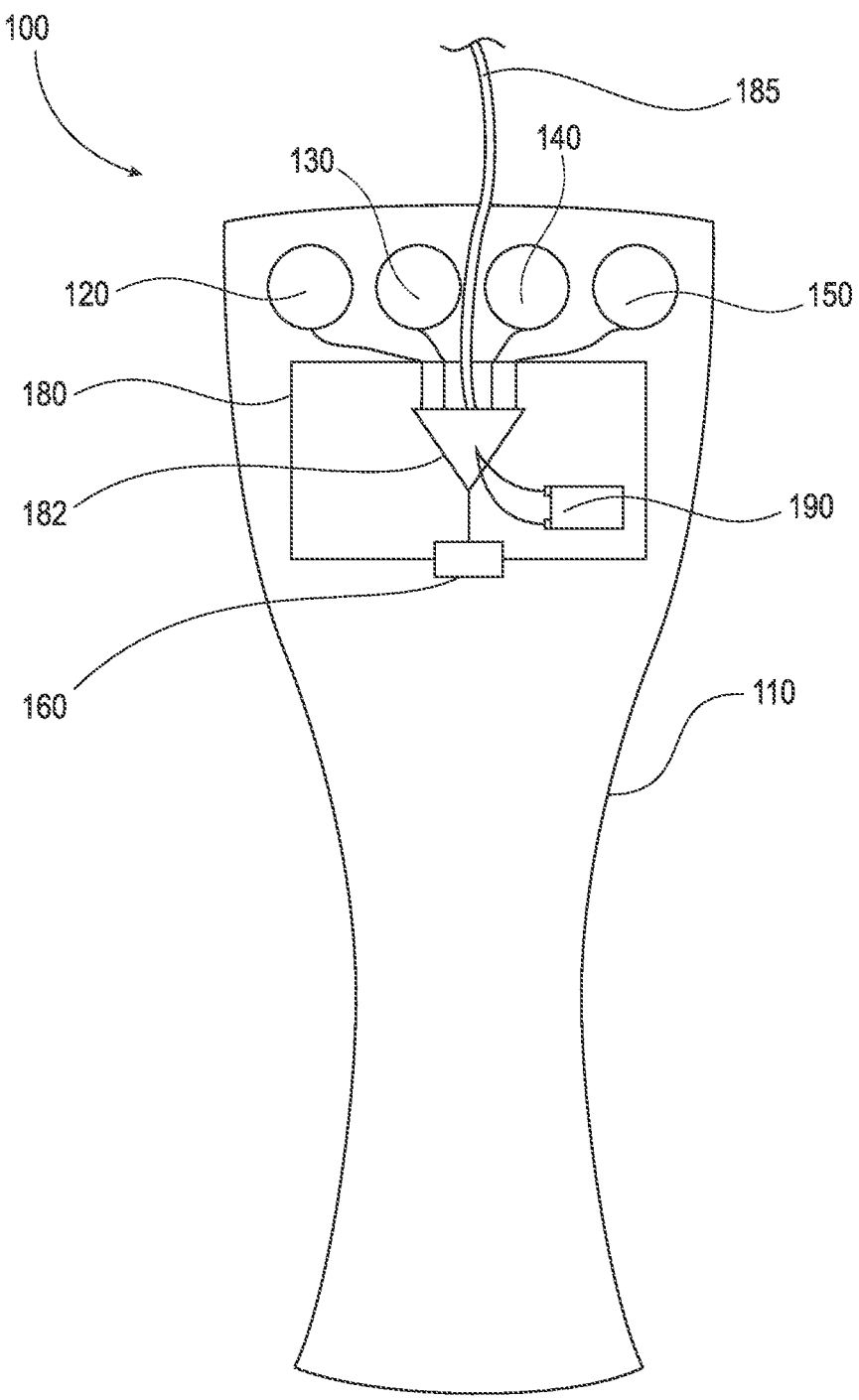
FIG. 1 illustrates an embodiment of the inventive subject matter describing tail piece.

100 Amplification system
110 Tailpiece
120 First Controllers
130 Second Controllers
140 Third Controllers
150 Fourth Controllers
160 output jacks
182 Electronic circuitry
185 input cable
190 power source
200 Exemplary system
210 Tail piece
205 Instrument
201 First String
211 First slot
330 Fastener
215 Fret
220 first aperture
202 Second string
212 second slot
240 Dual tone controller
203 third string
204 fourth string
213 third slot
250 volume controller
214 fourth slot
270 micro potentiometer
285 input cable
306 first string end
316 string pad
380 amplification unit
385 wires
390 Power source
400 Side View Drawing
500-550 Method steps of signal processing
600-650 Method steps
780 chin rest
705 musical instrument
710 body
720 side
750 bridge
730 finger board
760 chin rest knob
770 S shaped sound holes
1020 internal connection circuit
1030 cables
1040 tone controller
1070 output cables
1100 Schematic diagram of Electronics
1210 Shoulder-rest
1220 Control knob
1300 Shoulder rest electronic diagram
1400 Shoulder rest cross sectional view
1500-1570 Method steps

DESCRIPTION OF EMBODIMENTS

Stringed instruments produce sound from vibrating strings. Generally stringed instruments are constructed to include a portion of the instrument that vibrates with the strings, such as a soundboard or resonating chamber, in conjunction with an internal sound post.

Electric stringed instruments typically sense the string vibrations to produce an electrical signal and convert the electrical signal back into sound with a speaker. Acoustic Stringed instruments may be fitted with a transducer that is configured to sense string or body vibrations and convert them to electrical signals, also known as a pickup, for electrically amplifying the electrical signals and converting them to sound with a speaker. However, in acoustic systems control over amplification and tonal modification of sound is performed using a system external to the instrument. The inventive subject matter described herein, in various embodiments, enables a player of a stringed musical instrument to control an electronic signal for modifying and amplifying sound while playing the instrument.

Referring to FIG. 1, which depicts a system 100 for amplification and tonal modification of sound from a stringed musical instrument. The system 100 includes a tailpiece 110 for supporting one or more strings of a stringed musical instrument. Examples of stringed musical instruments that have a tailpiece include an upright bass, cello, violin, viola, archtop guitar, mandola, mandolin, octave mandolin. The tailpiece 110 is configured for housing the components of system 100 as described herein below.

Components of the electronic system 100 include an amplification unit 180, which includes electronic circuitry 182 for amplifying and modifying electrical signals provided by an input cable 185. Electrical power is provided to electronic circuitry 182 via a battery power source 190. An output signal generated by electronic circuitry 182 is provided to an output jack 160 for electrically connecting to a speaker for producing sound. Modification to the electrical signal is achieved, for example, via a first controller 120, a second controller 130, a third controller 140, and a fourth controller 150. Controllers 120, 130, 140, 150 are electrically coupled to electronic circuitry 182 via wires for example. System 100 may include fewer or greater number of controllers without departing from the scope hereof.

Tailpiece Configuration

Figure 2:
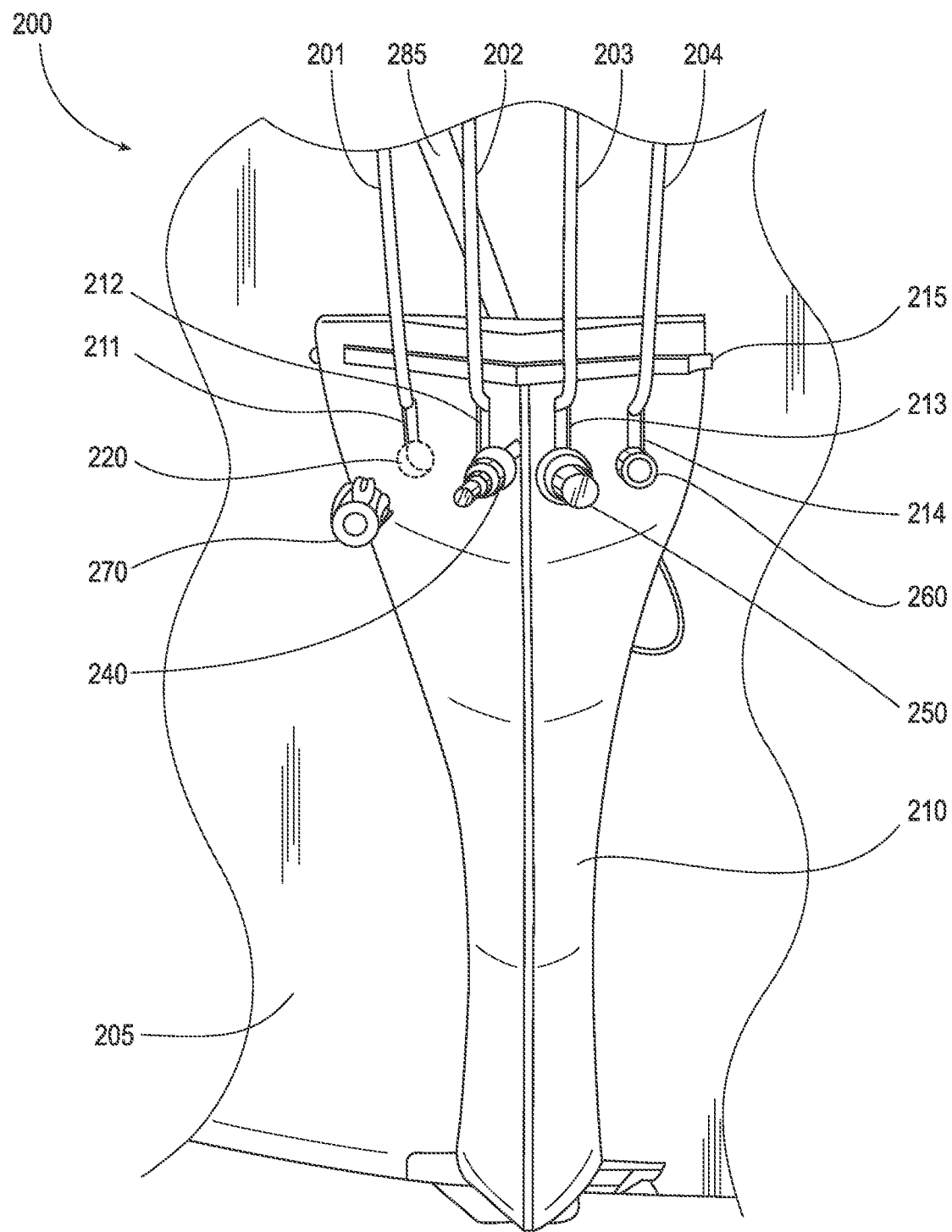
FIG. 2 illustrates another embodiment of the inventive subject matter describing the details of the electronics of the tail piece.
Figure 3:
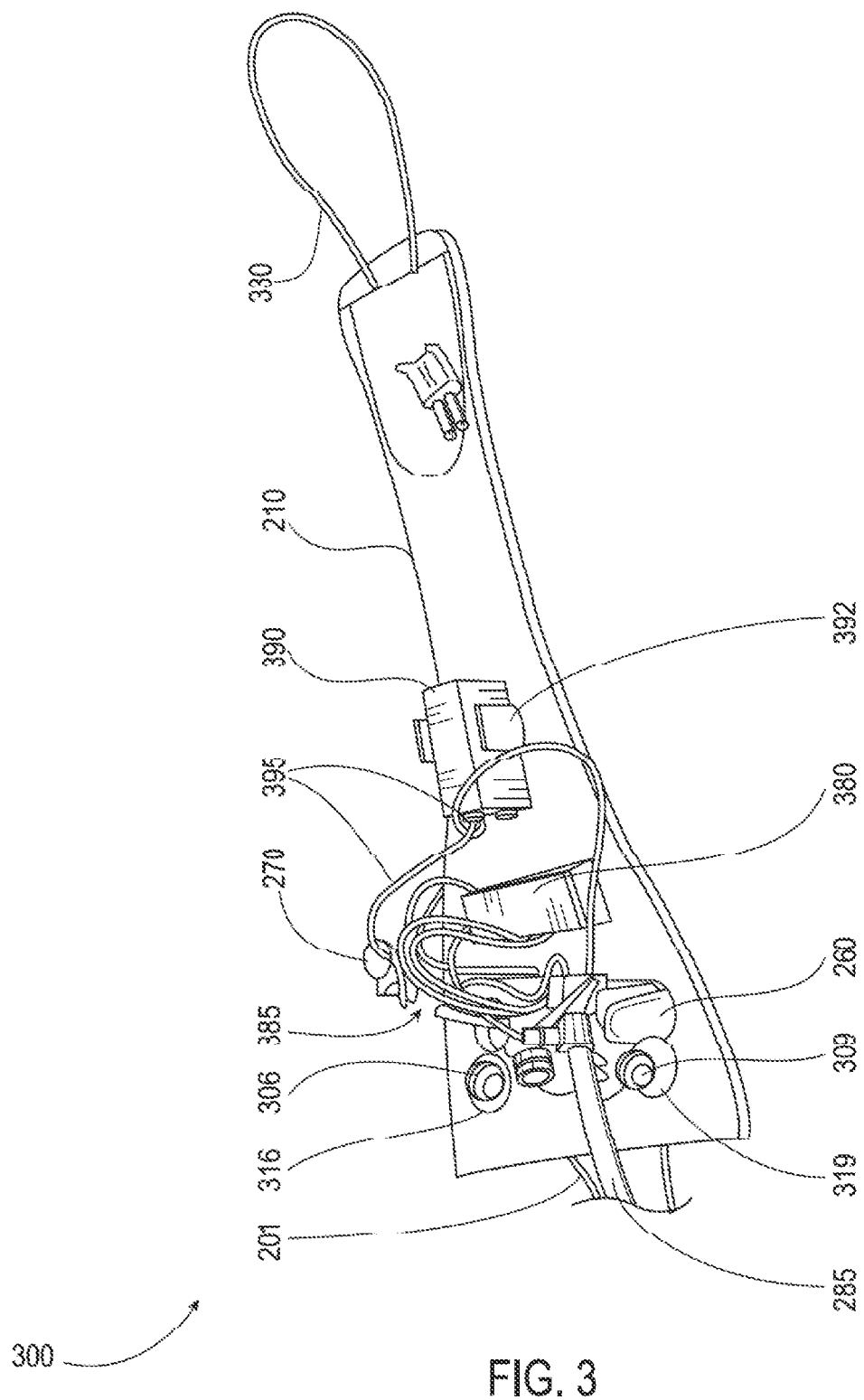
FIG. 3 illustrates the bottom side view of an interior of the tail piece electronics.
Figure 4:
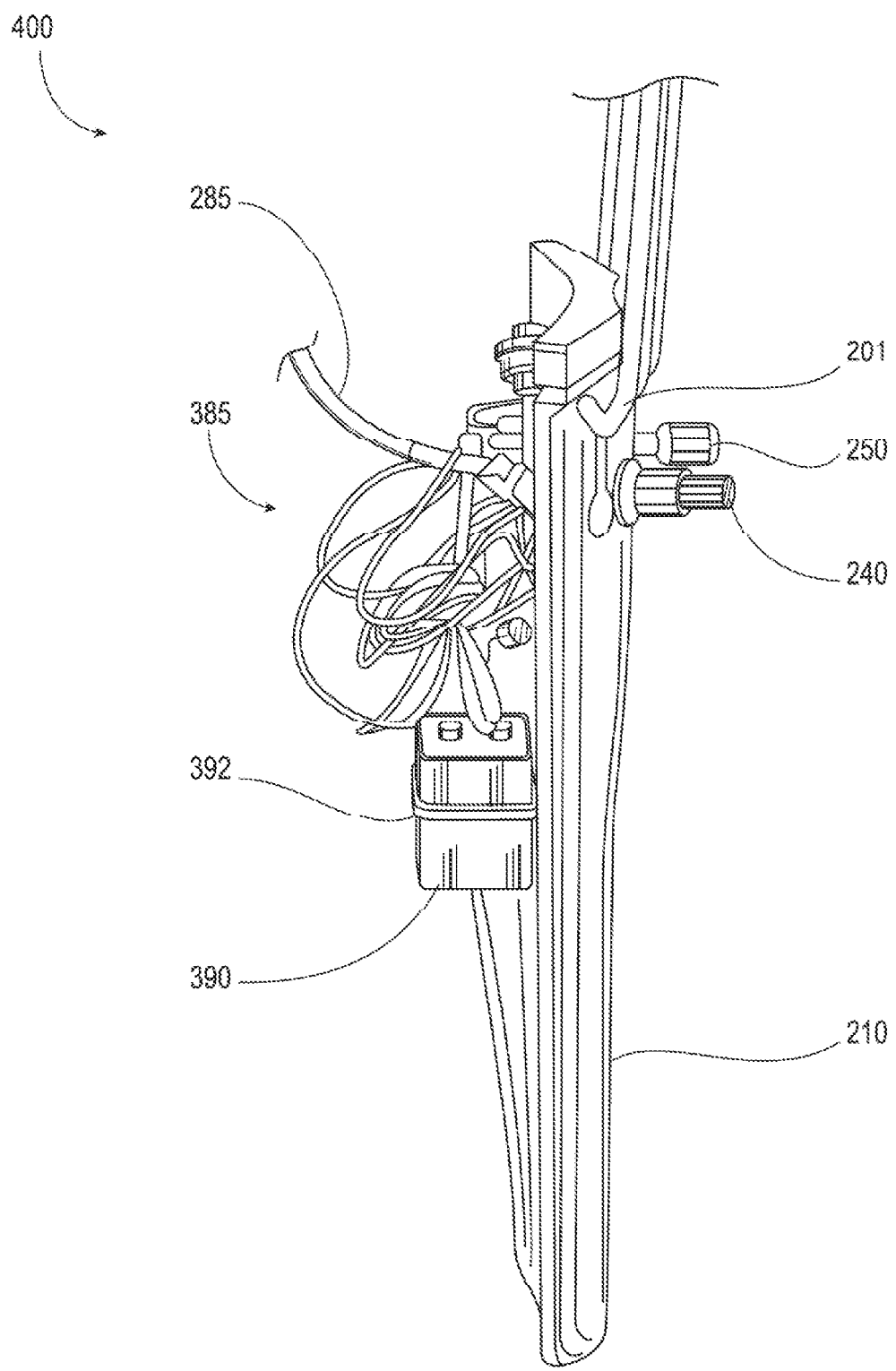
FIG. 4 illustrates the side view of the interior of the tail piece electronics.

FIG. 2 depicts an exemplary electronic system 200 for amplification and tonal modification of sound from a stringed musical instrument. System 200 is an example of system 100 of FIG. 1, and includes a tailpiece 210, which is an example of tailpiece 110 of FIG. 1. Referring to FIG. 2, 200 illustrates a front view of tailpiece 210 on an instrument 205. FIG. 3 depicts system 200 of FIG. 2 from a bottom side view of tailpiece 210. FIG. 4 depicts system 200 of FIG. 2 from a left side view. FIGS. 2, 3, and 4 are best viewed together with the following description.

Tailpiece 210 supports one or more strings, such as a first string 201 by engaging first string 201 in a first slot 211. An opposite end of first string 201 is mechanically coupled to an instrument bridge, for example. Tailpiece 210 is mechanically coupled to instrument 205 via fastener 330 (see FIG. 3) and is held taught by tension of the at least one string. Fastener 330 may be made of KEVLAR® (of DUPONT™), steel, nylon cord or piping, or natural casing for example. Tailpiece 210 includes beveled three-dimensional topography configured to allow integration of electronic components for amplifying and modifying sound, while limiting visibility of the electronic components. Tailpiece 210 may be made of wood, carbon fiber, metal, plastic or other similar material for example. A fret 215 is located on tailpiece 210 to provide an intonation point for the at least one string.

One or more through apertures, such as a first aperture 220, allow string removal and replacement. Each of the one or more through holes is positioned adjacent to a slot for securing a string. For example, first aperture 220 allows a string end, such as a first string end 306 (shown in FIG. 3), to pass through tailpiece 210 for engaging in first slot 211.

A first string pad 316 is located between first string end 306 and tailpiece 210 to minimize vibration there between. A fourth string pad 319 can be located between fourth string end 309 and tailpiece 210. First aperture 220 may remain open, as depicted in FIG. 2, or first aperture 220 may be configured to include a component of system 200, such as a controller or output jack for example, without departing from the scope hereof.

A second string 202 is for example engaged in a second slot 212 as shown in FIG. 2. A second aperture through tailpiece 210 may be configured to house a component of system 200, such as a dual tone controller 240. In an embodiment, dual tone controller 240 is a dual concentric trim potentiometer that provides base control via an outer knob and treble control via an inner knob. Inner and outer knobs of dual tone controller 240 may be configured for adjustment by hand.

A third string 203 is for example engaged in a third slot 213. A third aperture through tailpiece 210 may be configured to house a component of system 200, such as a volume controller 250 that provides control of sound loudness produced from an external speaker. Volume controller 250 may include a knob configured for adjustment by hand.

A fourth string 204 is for example engaged in a fourth slot 214. A fourth aperture through tailpiece 210 may be configured to house a component of system 200, such as an output jack 260. Output jack 260 provides electrical connection for outputting an electrical signal produced by system 200. An output cable may be used to electrically connect system 200 to an external speaker and/or amplifier via output jack 260, for example.

In another embodiment, an output signal of system 200 is transmitted wirelessly via radio waves to an external speaker equipped with a radio receiver.

In an embodiment, system 200 includes a micro-potentiometer 270 for enhancing and adjusting sound in mid-range frequencies by, for example, attenuating mid-range frequency signals. Micro-potentiometer 270 may be configured for adjustment with a tool (e.g., a screwdriver), or it may be configured with a knob for adjustment by hand. Micro-potentiometer 270 may be housed in front or behind tailpiece 210 or located in a aperture through tailpiece 210, such as first aperture 220 for example.

At least one pick up is located beneath first, second, third, and fourth strings 201, 202, 203, 204, to sense vibration of the strings and to generate an electrical signal of the vibration. An input cable 285 couples the electrical signal to an amplification unit 380. In an embodiment, a plurality of pickups is located beneath the strings to sense vibration at a plurality of locations on instrument 205, thereby generating a plurality of electrical signals. The plurality of pickups may be located at various positions on the instrument body or bridge for example. The plurality of electrical signals is transmitted from the plurality of pickups via input cable 285. Input cable 285 is for example a multiple-channel input cable with multiple input jacks to receive a plurality of electrical signals.

In an embodiment, first aperture 220 is configured to include a blend controller for blending electrical signals from the plurality of pickups. The blend controller includes a control knob or dial, for example, to enable a player to modify blending of the electrical signals while playing the stringed instrument.

As shown in FIG. 3, system 300 further includes an amplification unit 380 for amplifying, blending, and modifying an electrical signal from at least one pickup. Amplification unit 380 is mounted to bottom side of tailpiece 210 with an adhesive for example. Alternatively, amplification unit 380 may be set into a small recession of tailpiece 210 and secured with a band or strap. Wires 385 electrically couple amplification unit 380 to at least one controller, such as dual tone controller 240 or volume controller 250, to enable modification of the electrical signal by a player of the instrument. In an embodiment, amplification unit 380 is a BARTOLINI® uTCT tone control module. An amplified and modified signal is transmitted via electrical coupling from amplification unit 380 to output jack 260. An output cable may be inserted into output jack 260 for transmitting the amplified and modified signal from system 200 to at least one speaker and/or amplifier for producing sound. System 300 may include a power source 390, such as a battery pack that ranges from 3V-9V, for example, to provide electrical current via leads 395 for powering amplification unit 380. Power source 390 is secured to tailpiece 210 using a clamp 392, for example.

In an embodiment, components of system 300, including wires 385, leads 395 and amplification unit 380, are housed in a box mounted to tailpiece 210 to hide from view. Onboard power source 390 may be located inside the box behind a removable panel, for example, to enable easy replacement.

Now referring back to FIG. 3 and FIG. 4, which depict the system attached to the reverse side of the tailpiece. By way of example the length of a full-size violin tailpiece 210 is 115mm and the width is 42mm. The system 300, 400 may also be dimensioned to be incorporated and integrated within the tailpiece is such a manner that the electronics lay flat within the exterior curve dimensions of the tailpiece. Implementations may further include the use of rechargeable lithium ion batteries so that the components do not project over the curved edge of the tailpiece. Other implementations may encapsulate the amplifier and the rechargeable battery within one component system.

Figure 5:
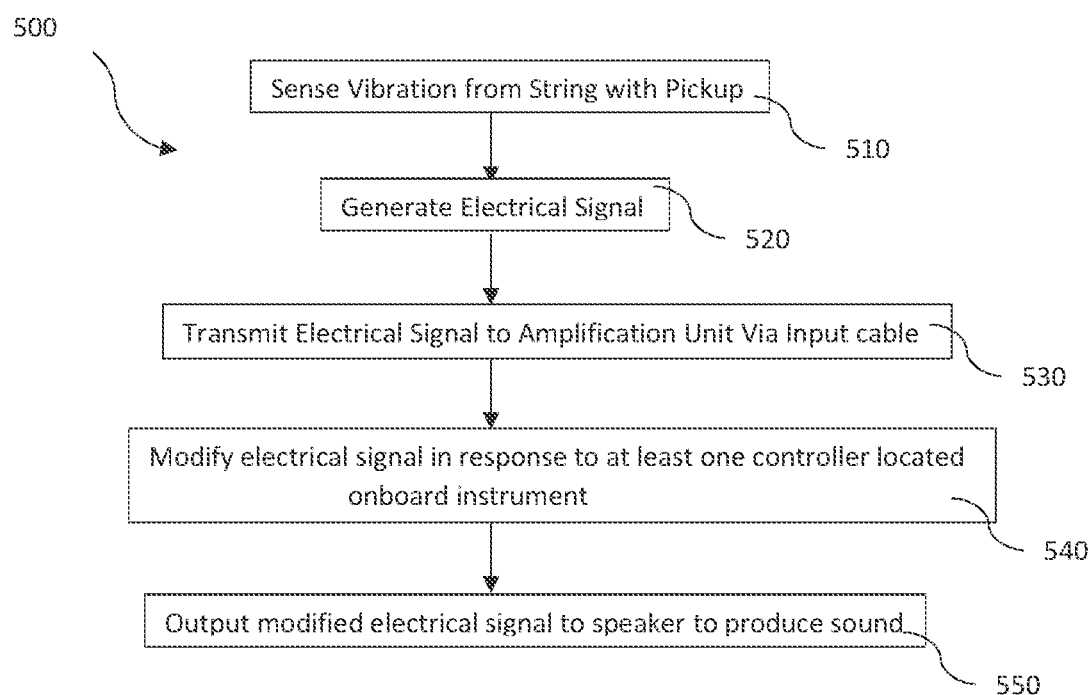
FIG. 5 illustrates yet another embodiment describing the steps involved in controlling sound amplification and tonal modification of a stringed musical instrument.

FIG. 5 shows steps of a method 500 for controlling sound amplification and tonal modification onboard an acoustic stringed instrument. In an example of method 500, an onboard electronic system 200 is used to amplify and modify sound from instrument 205 of FIG. 2. In step 510, method 500 senses vibration from at least one string with a pickup. In an example of step 510, a pickup located on instrument 205 senses vibration of first string 201, second string 202, third string 203, and fourth string 204.

In step 520, method 500 generates an electrical signal of the vibration sensed in step 510. In an example of step 520, the pickup generates an electric signal corresponding to vibration of first string 201, second string 202, third string 203, and fourth string 204.

In step 530, method 500 transmits the electrical signal generated in step 520 to an amplification unit via an input cable. In an example of step 530, the electrical signal is transmitted from the pickup to amplification unit 380 via input cable 285.

In step 540, method 500 modifies the electrical signal in response to at least one controller located onboard the instrument. In an example of step 540, amplification unit 380 modifies the electrical signal in response to dual tone controller 240, which provides base control via an outer knob and treble control via an inner knob. In another example of step 540, amplification unit 380 modifies the electrical signal in response to volume controller 250, which provides onboard control of sound loudness produced from an external speaker.

In step 550, method 500 outputs the modified electrical signal to a speaker to produce sound. In an example of step 550, the modified electrical signal is outputted via output jack 260 to an output cable that is electrically connected to an external speaker.

System 200 that executes method 500 may provide a player of acoustic stringed instruments ability to amplify, modify, and pre-condition an electrical signal of sound without interfering with sound quality or playing ability of the instrument.

Figure 6:
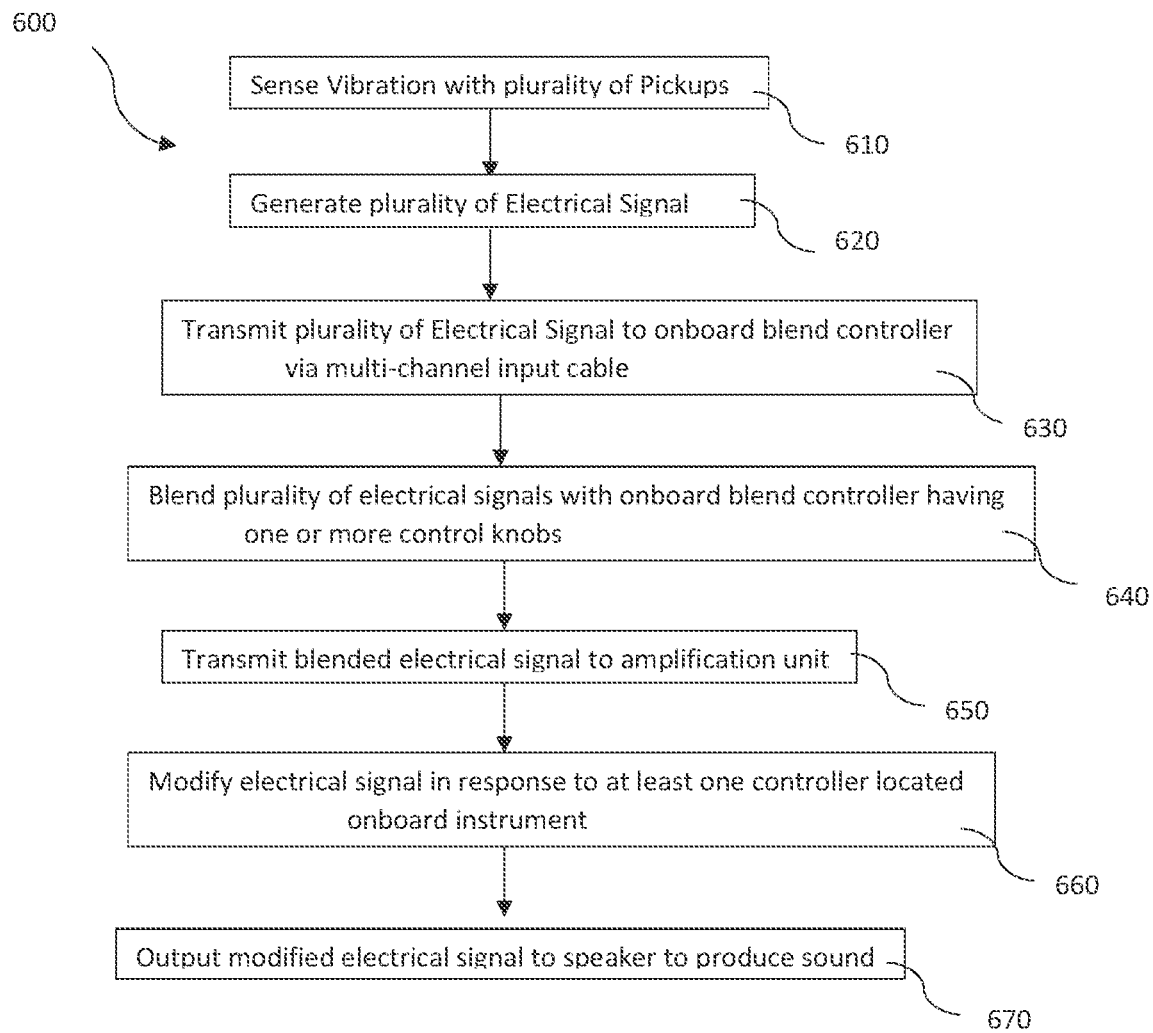
FIG. 6 illustrates an embodiment of the inventive subject matter describing the electronic circuitry hosted in the tail piece and chin rest portions.

FIG. 6 shows steps of a method 600 for controlling sound amplification and tonal modification of a stringed musical instrument. In an example of method 600, an electronic system 200 is used to control, amplify and modify sound from instrument 205 of FIG. 2.

In step 610, method 600 senses vibration from one or more strings with a plurality of pickups located at various locations on the stringed instrument. In an example of step 610, a plurality of pickups located on instrument 205 sense vibrations of first string 201, second string 202, third string 203, and fourth string 204.

In step 620, method 600 generates a plurality of electrical signals from the vibration sensed with a plurality of pickups in step 610. In an example of step 620, the plurality of pickups generates a plurality of electric signals corresponding to vibration of first string 201, second string 202, third string 203, and fourth string 204 at various locations on instrument 205.

In step 630, method 600 transmits the plurality of electrical signals generated in step 620 to a blend controller via a multi-channel input cable. In an example of step 630, the plurality of electrical signals is transmitted from the plurality of pickups to the blend controller via input cable 285.

In step 640, method 600 blends the plurality of electrical signals with the blend controller. In an example of step 640, the blend controller includes a control knob or dial to enable a player to modify blending of the electrical signals while playing instrument 205.

In step 650, method 600 transmits the blended electrical signal to the amplification unit. In an example of step 650, the blended electrical signal is transmitted from the blend controller to amplification unit 380.

In step 660, method 600 modifies the blended electrical signal in response to one or more controllers located the instrument. Step 660 is an example of step 540 of FIG. 5. In an example of step 640, amplification unit 380 modifies the blended electrical signal in response to dual tone controller 240, which provides base control via an outer knob and treble control via an inner knob. In another example of step 640, amplification unit 380 modifies the blended electrical signal in response to volume controller 250, which provides control of sound loudness produced from an external speaker.

In step 670, method 600 outputs the modified electrical signal to a speaker to produce sound. Step 670 is an example of step 550 of FIG. 5. In an example of step 670, the modified electrical signal is outputted via output jack 260 to an output cable that is electrically connected to an external speaker.

System 200 that executes method 600 may provide a player of stringed instruments ability to blend electrical signals from a plurality of pickups located at various positions on the instrument, and to amplify, modify, and pre-condition the blended signal without interfering with sound quality or playing ability of the instrument.

Chinrest Configuration

Figure 7:
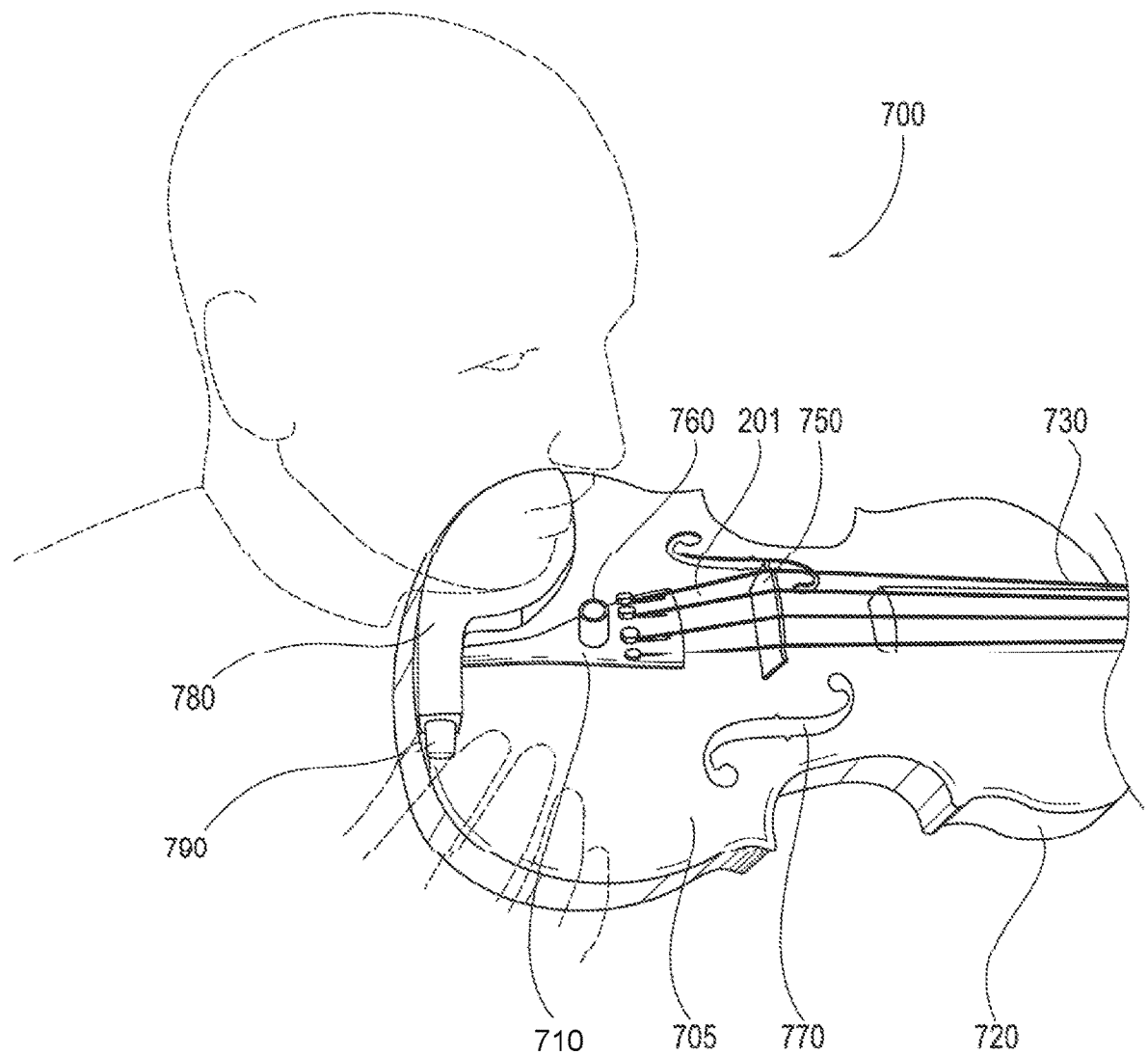
FIG. 7 is a perspective view showing a stringed musical instrument in the usual playing position and orientation.

In an embodiment, as shown in FIG. 7, the amplification subsystem is incorporated into the chinrest of the stringed instrument. The chinrest amplifier system 700 of FIG. 7 depicts a musician who controls the concentrically stacked equilibrium tone knob of the chinrest 780 with ease of access, while the chinrest 780 supports the chin of the musician.

Still referring to FIG. 7, stringed musical instrument 705 includes a body and sides 720. One or more strings 201 are tensioned over the bridge 750 connected between pegs (not shown) and the tailpiece 710 and above the finger board 730. The chin is placed on the chin rest 780. The musician can control the equilibrium tone control 790. Volume control 760 represents the knob for adjusting the volume of the stringed musical instrument and the sound holes, also known as f-holes 770 are also shown in FIG. 7.

Figure 8:
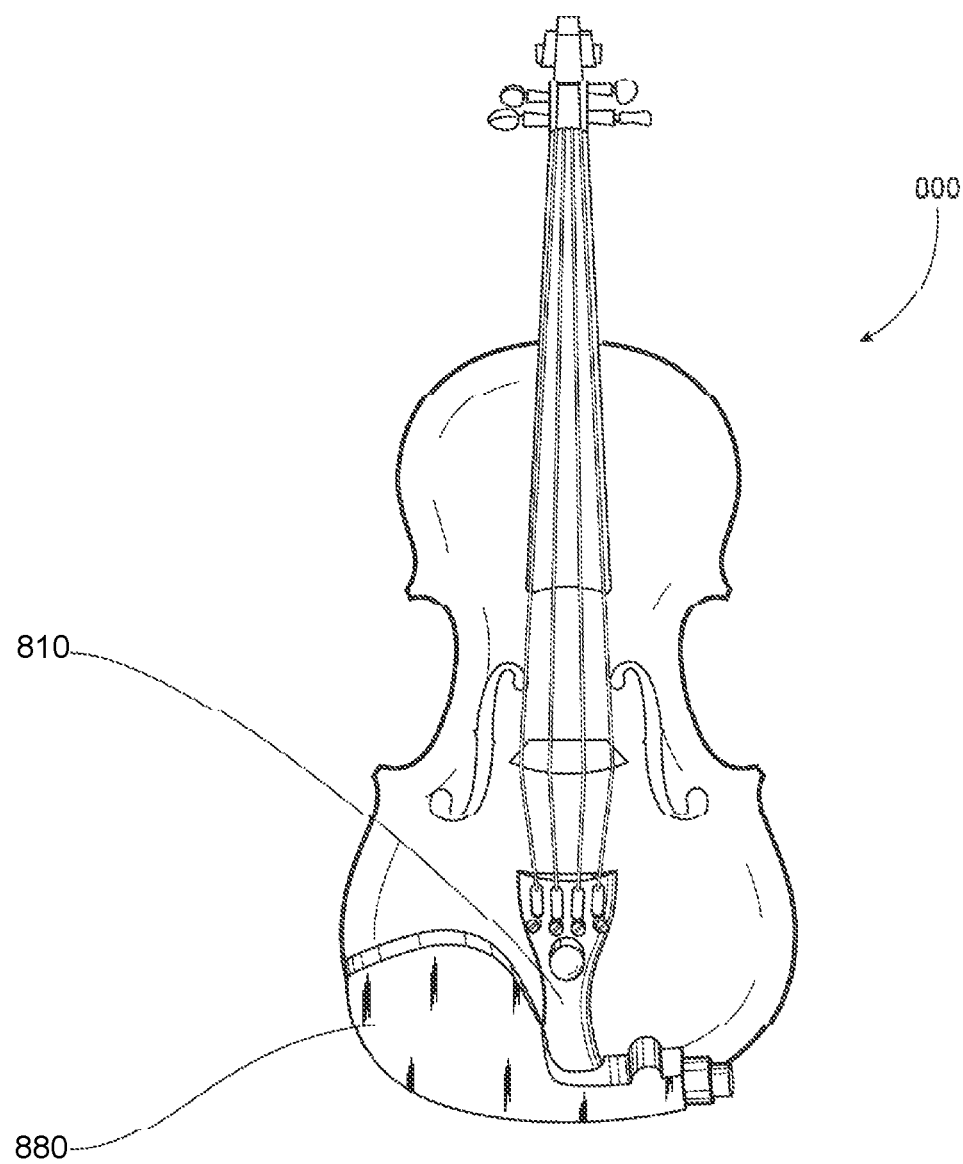
FIG. 8 illustrates the front view of the instrument with the electronic circuitry embedded in the chin rest section.

Referring to FIG. 8, the chinrest 880 and tailpiece 810 can host the onboard electronic system for amplification and tonal modification of sound from an acoustic stringed musical instrument.

Figure 9:
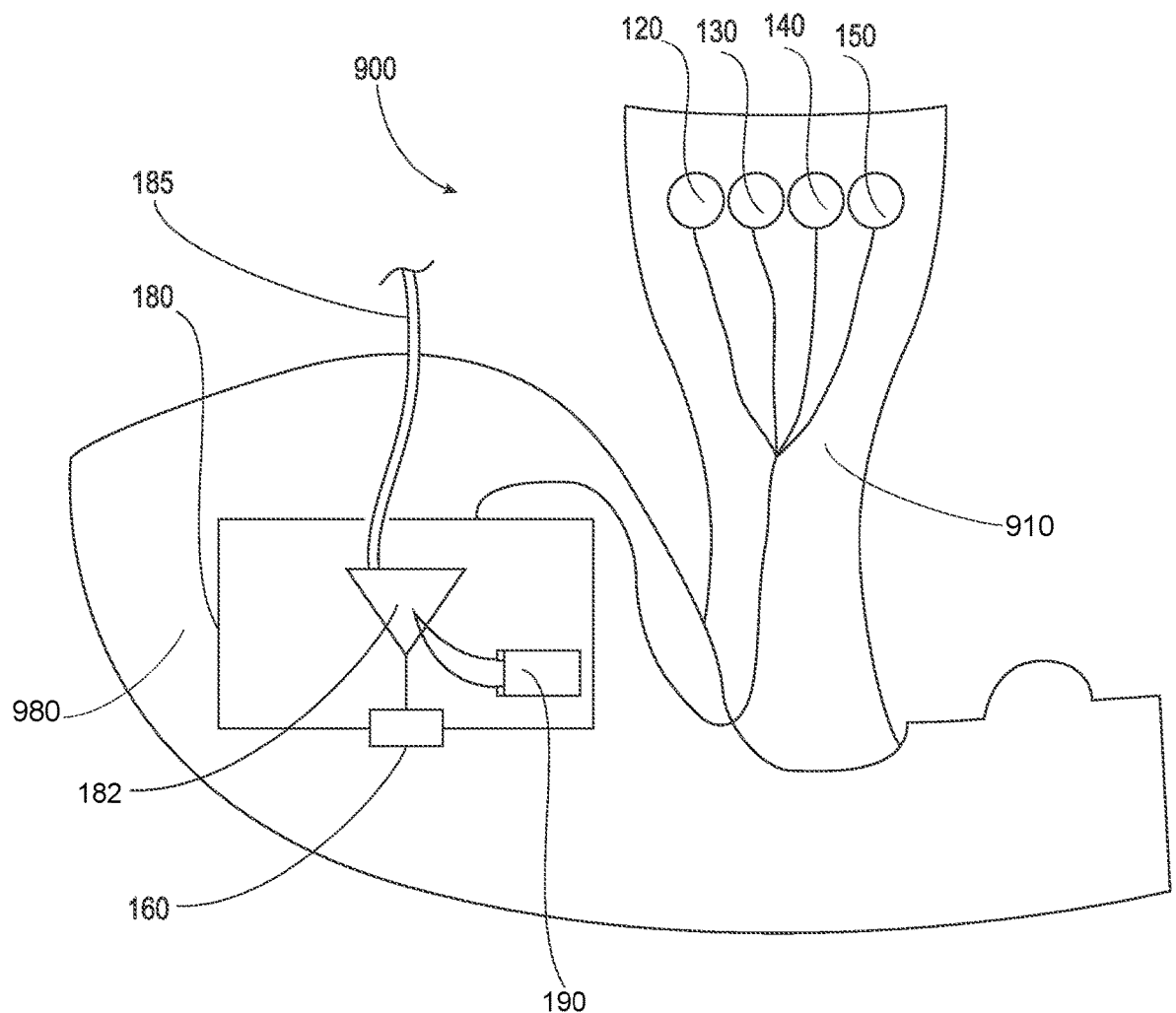
FIG. 9 depicts an electronic system for amplification and tonal modification of sound from a stringed musical instrument.

Referring to FIG. 9, which depicts an electronic system 900 for amplification and tonal modification of sound from a stringed musical instrument. System 900 includes a tailpiece 910 for supporting one or more strings of a stringed musical instrument. Examples of stringed musical instruments include an upright bass, cello, violin, viola, archtop guitar, mandola, mandolin, octave mandolin and any other instrument that typically includes a tailpiece. System 900 also includes a chinrest 980. Tailpiece 910 and chinrest 980 are configured for housing components of system 900 as described herein below.

Components of the electronic system 900 include an amplification unit 180, which includes electronic circuitry 182 for amplifying and modifying electrical signals provided by an input cable 185. Electrical power is provided to electronic circuitry 182 via a battery power source 190. An output signal generated by electronic circuitry 182 is provided to an output jack 160 for electrically connecting to a speaker for producing sound. Modification to the electrical signal is achieved, for example, via a first controller 120, a second controller 130, a third controller 140, and a fourth controller 150. Controllers 120, 130, 140, 150 are electrically coupled to electronic circuitry 182 via wires for example. System 900 may include fewer or greater number of controllers without departing from the scope hereof.

Figure 10:
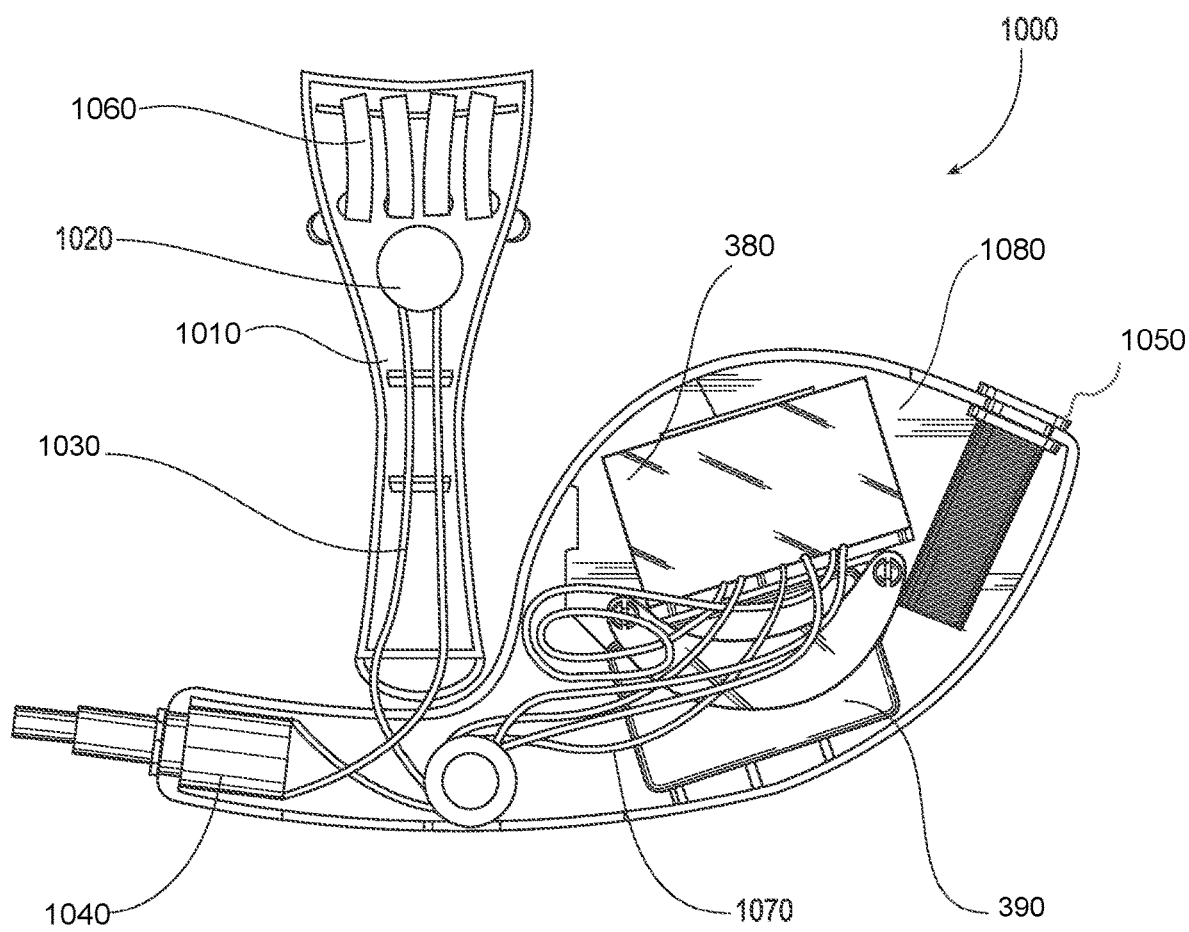
FIG. 10 represents the cross-sectional view of the tail piece portion and the chin rest portion hosting the control unit electronic circuitry.

In another embodiment as shown in FIG. 10, 1000 represents the cross-sectional view of the tailpiece 1010 and the chinrest 1080 housing the control unit electronic circuitry for achieving the fine-tuning control. The slots 1060 of the tailpiece 1010 make way for the strings to give out the signal to the electronic circuitry through the internal connection circuit 1020. The cables 1030 carry the signals for blending and amplifying to the desired levels through controller 1040 and the amplifier 380. The entire circuit is powered by a battery source 390 located adjacent to the circuit. The output cables 1070 carry the blended and amplified signals to the output jack 1050 to an externally placed loudspeaker.

Figure 11:
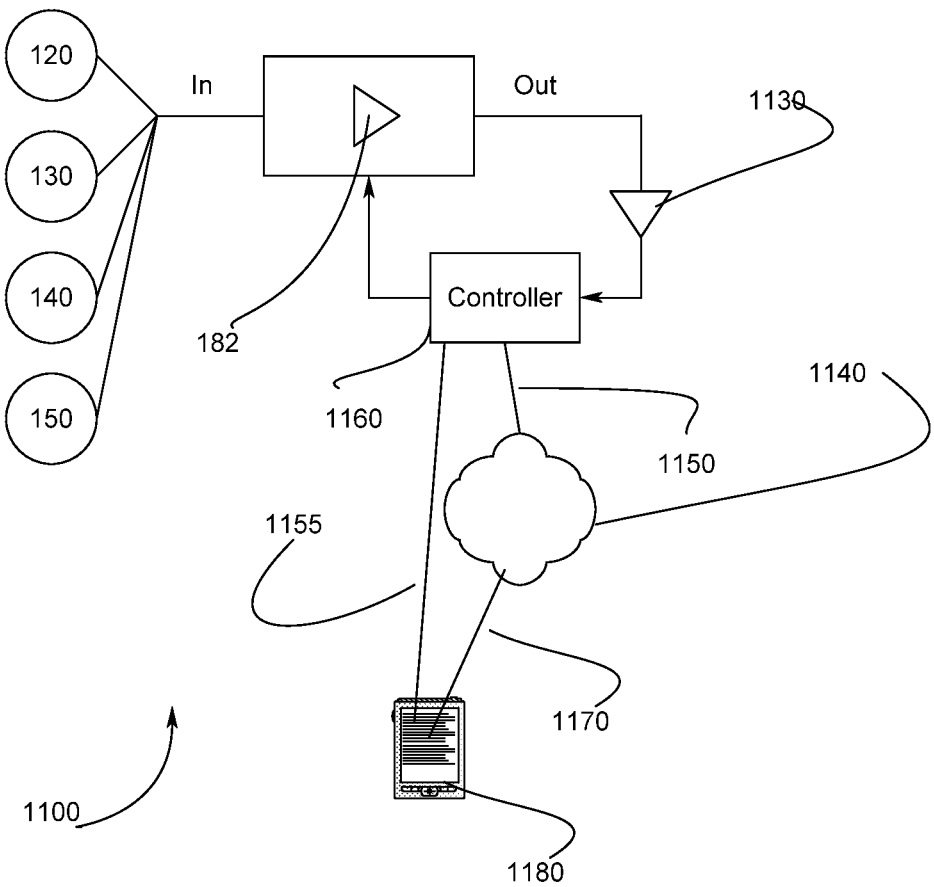
FIG. 11 illustrates a system block diagram showing interfaces of instrument computing platforms.

Now referring to FIG. 11 in conjunction with FIG. 1, the controllers 120-150 are connected to the electronic circuitry 182 of the system 1100. The output of the electronic circuitry 182 is encoded by suitable analog to digital encoder in the audio range. The encoded signal is processed by a controller 1160. The controller 1160 would typically be any small, low power microcontroller, such as the Arduino Uno sold by Sparkfun electronics. The controller 1160 and the encoder 1130 may be incorporated within one physical package. The wireless output 1150 of the controller 1160 may be routed via a network 1140 which is then communicatively coupled 1170 to personal computing device 1180. The network 1140 is typically the Internet, but may be any network, including but not limited to a Local Area Network (LAN), a Metropolitan Area Network (MAN), a Wide Area Network (WAN), a mobile wired or wireless network, a private network, or a virtual private network. The personal computing device 1180 may be any computing platform, such as a laptop, cell phone, or tablet, which can be communicatively coupled 1170 to the network 1140. Alternately, the output from the controller may be communicated on standard audio communication bus 1155, such as the MIDI interface.

Shoulder-Rest Configuration

Figure 12:
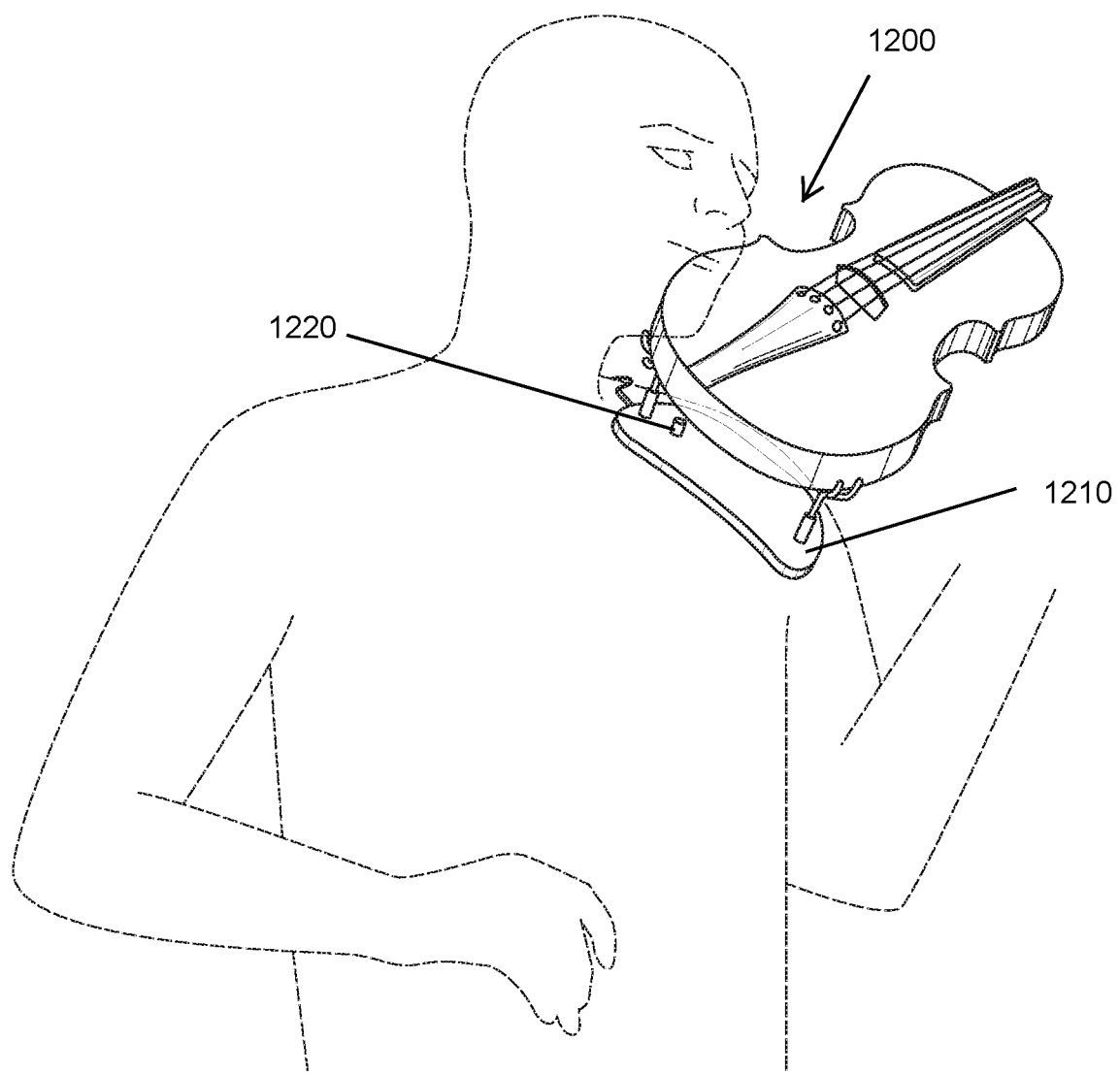
FIG. 12. is a perspective view showing a stringed musical instrument in the usual playing position and orientation.

In an alternate implementation, as shown in FIG. 12 the amplification subsystem is incorporated into the shoulder rest hosting the stringed instrument. The shoulder-rest amplifier system 1200 is illustrated with an instrumentalist who simultaneously uses the controls that are mounted on the shoulder-rest 1210 to simultaneously support the stringed musical instrument comfortably on his/her shoulder and provide ease of access to amplifier controls 1220.

Figure 13:
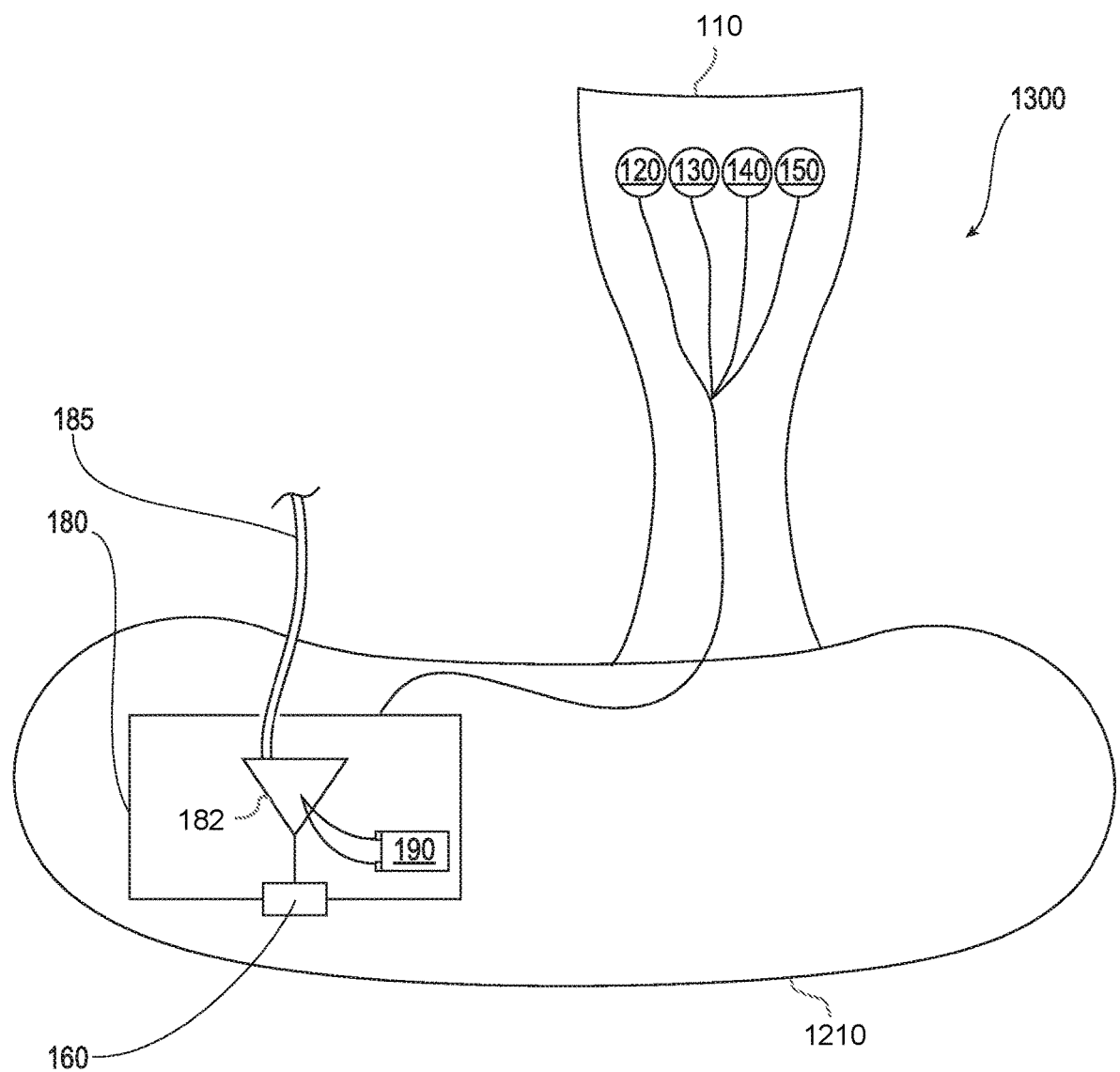
FIG. 13 illustrates the front view of the instrument with the electronic circuitry embedded in the shoulder-rest portion.

Referring to FIG. 13, which depicts an electronic system 1300 for amplification and tonal modification of sound from a stringed musical instrument. System 1300 includes a tailpiece 110 for supporting one or more strings of a stringed musical instrument. Examples of stringed musical instruments include an upright bass, cello, violin, viola, archtop guitar, mandola, mandolin, octave mandolin and any other instrument that typically includes a tailpiece. System 1300 also includes a shoulder-rest section 1210. Tailpiece 110 and shoulder-rest 1210 are configured for housing components of system 1300 as described herein below.

Components of the electronic system 1300 include an amplification unit 180, which includes electronic circuitry 182 for amplifying and modifying electrical signals provided by an input cable 185. Electrical power is provided to electronic circuitry 182 via a battery power source 190. An output signal generated by electronic circuitry 182 is provided to an output jack 160 for electrically connecting to a speaker for producing sound. Modification to the electrical signal is achieved, for example, via a first controller 120, a second controller 130, a third controller 140, and a fourth controller 150. Controllers 120, 130, 140, 150 are electrically coupled to electronic circuitry 182 via wires for example. System 1300 may include fewer or greater number of controllers without departing from the scope hereof.

Figure 14:
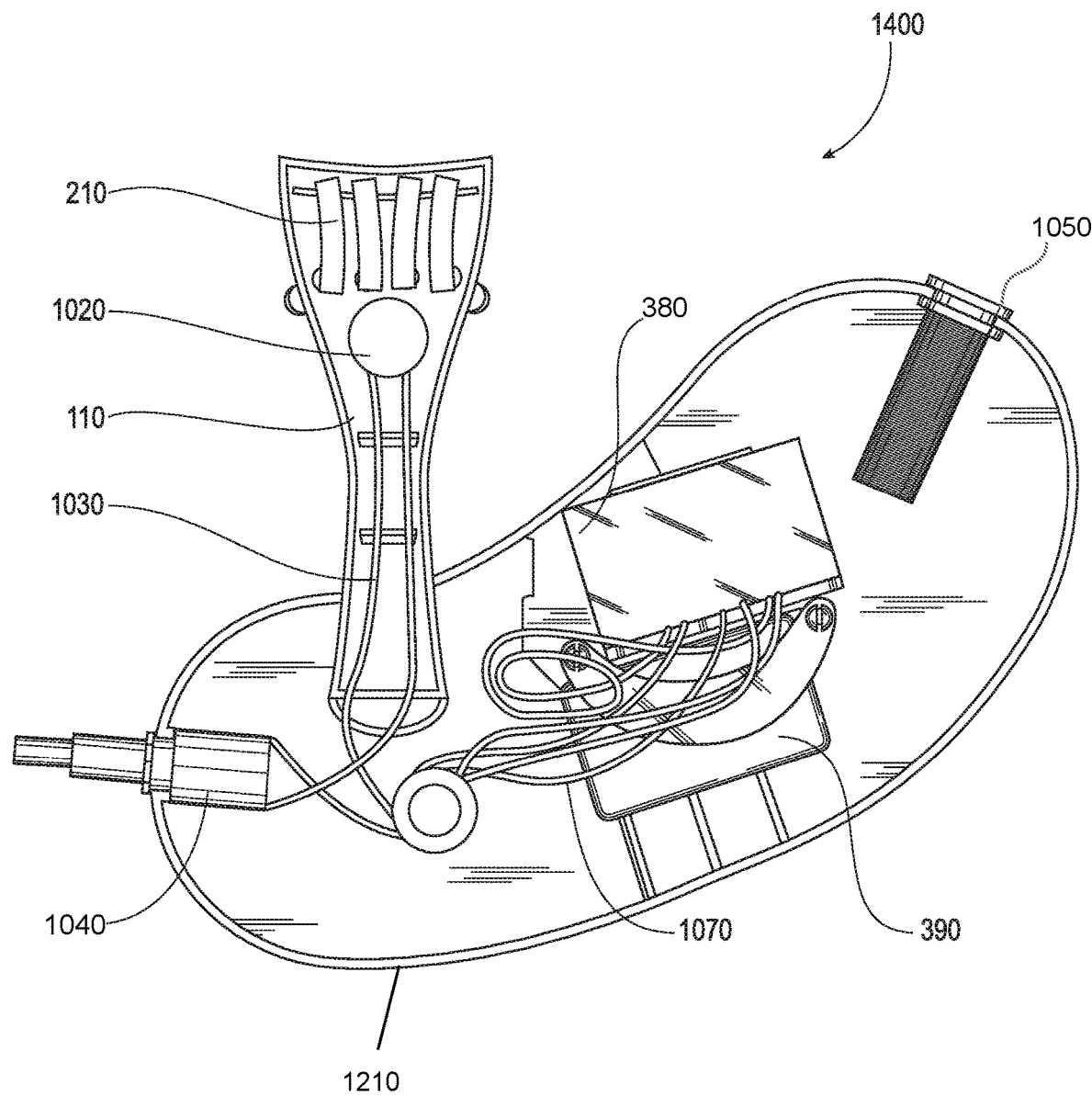
FIG. 14 depicts an electronic system for amplification and tonal modification of sound from a stringed musical instrument embedded in the shoulder-rest portions

In another embodiment as shown in FIG. 14, system 1400 represents the cross-sectional view of the tailpiece 110 and the shoulder-rest 1210 housing the control unit electronic circuitry for achieving the fine-tuning control. The slots 210 of the tailpiece 110 make way for the strings to give out the signal to the electronic circuitry through the internal connection circuit 1020. The cables 1030 carry the signals for blending and amplifying to the desired levels through controller 1040 and the amplifier 380. The entire circuit is powered by a battery source 390 located adjacent to the circuit. The output cables 1070 carry the blended and amplified signals to the output jack 1050 to an externally placed loudspeaker.

Figure 15:
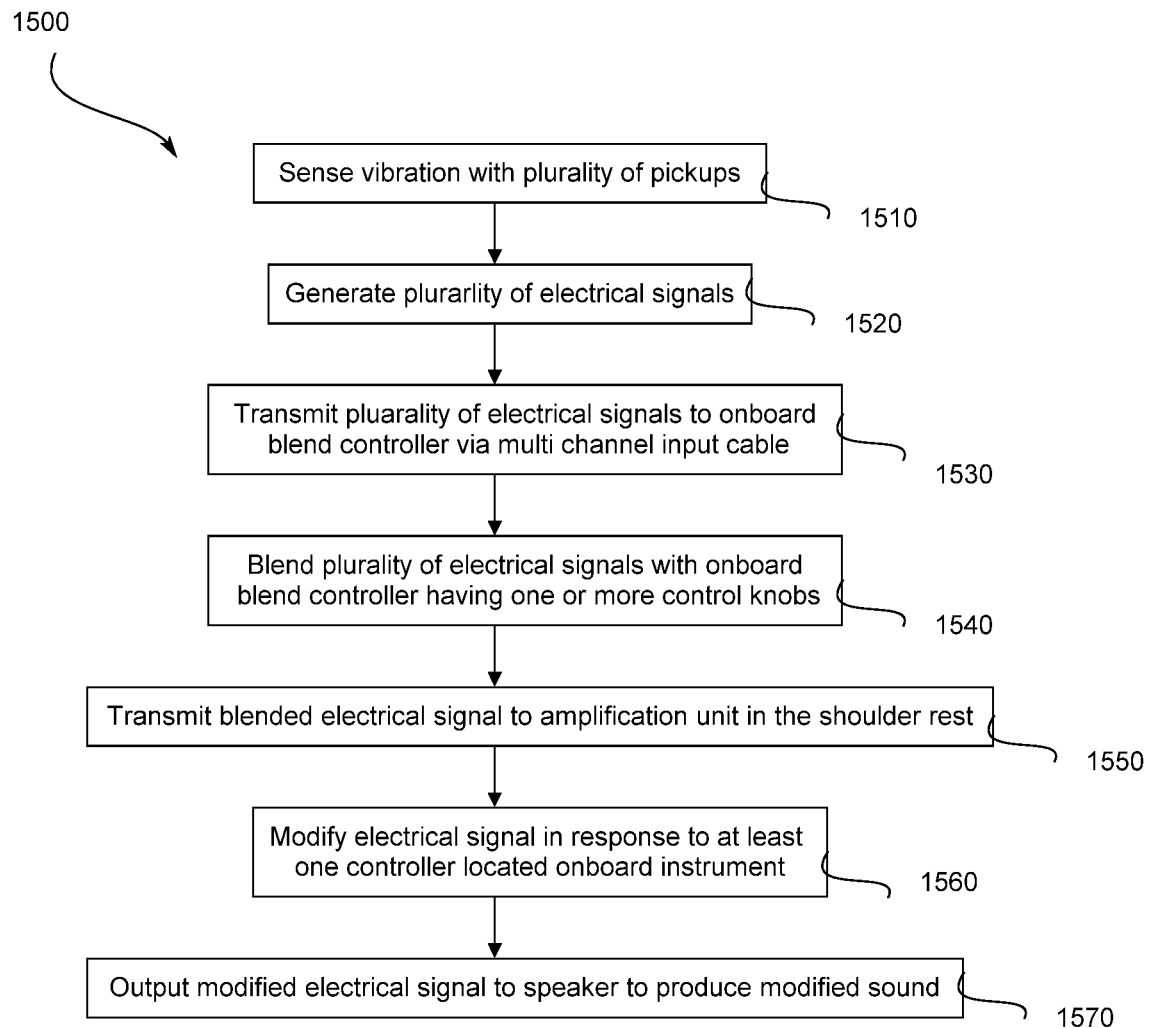
FIG. 15 illustrates the steps involved in controlling sound amplification and tonal modification of a stringed musical instrument.

FIG. 15 shows steps of a method 1500 for controlling sound amplification and tonal modification of a stringed musical instrument. In an example of method 1500, an electronic system 1300 is used to control, amplify and modify sound from instrument as shown in FIG. 12.

In step 1510, method 1500 senses vibration from one or more strings with a plurality of pickups located at various locations on the stringed instrument. In an example of step 1510, a plurality of pickups located on instrument sense vibrations of first string 201, second string 202, third string 203, and fourth string 204.

In step 1520, method 1500 generates a plurality of electrical signals from the vibration sensed with a plurality of pickups in step 1510. In an example of step 1520, the plurality of pickups generates a plurality of electric signals corresponding to vibration of first string 201, second string 202, third string 203, and fourth string 204 at various locations on instrument 205.

In step 1530, method 1500 transmits the plurality of electrical signals generated in step 1520 to a blend controller via a multi-channel input cable. In an example of step 1530, the plurality of electrical signals is transmitted from the plurality of pickups to the blend controller via input cable 285.

In step 1540, method 1500 blends the plurality of electrical signals with the blend controller. In an example of step 1540, the blend controller includes a control knob or dial to enable a player to modify blending of the electrical signals while playing instrument 205.

In step 1550, method 1500 transmits the blended electrical signal to the amplification unit. In an example of step 1550, the blended electrical signal is transmitted from the blend controller to amplification unit 380.

In step 1560, method 1500 modifies the blended electrical signal in response to one or more controllers located the instrument. Step 1560 is an example of step 1540 of FIG. 5. In an example of step 1540, amplification unit 380 modifies the blended electrical signal in response to dual tone controller 240, which provides base control via an outer knob and treble control via an inner knob. In another example of step 1540, amplification unit 380 modifies the blended electrical signal in response to volume controller 250, which provides control of sound loudness produced from an external speaker.

In step 1570, method 1500 outputs the modified electrical signal to a speaker to produce sound. Step 1570 is an example of step 1550 of FIG. 5. In an example of step 1570, the modified electrical signal is outputted via output jack 260 to an output cable that is electrically connected to an external speaker.

System 1300 that executes method 1500 may provide a player of stringed instruments ability to blend electrical signals from a plurality of pickups located at various positions on the instrument, and to amplify, modify, and precondition the blended signal without interfering with sound quality or playing ability of the instrument.

The many aspects and benefits of the invention are apparent from the detailed description, and thus, it is intended for the following claims to cover all such aspects and benefits of the invention which fall within the scope and spirit of the invention. In addition, because numerous modifications and variations will be obvious and readily occur to those skilled in the art, the claims should not be construed to limit the invention to the exact construction and operation illustrated and described herein. Accordingly, all suitable modifications and equivalents should be understood to fall within the scope of the invention as claimed herein.

The invention claimed is:

1. An onboard electronic system in operation with an acoustic stringed musical instrument, comprising:
    a bridge having at least one pickup in electromagnetic alignment with one or more strings of the acoustic stringed musical instrument, wherein the at least one pickup senses vibrations of the one or more strings and generates electrical signals of the vibrations of the one or more strings;
    a tailpiece, comprising a first housing having a first hollow interior receiving space;
    a shoulder rest removably attached to the acoustic stringed musical instrument, the shoulder rest comprising a second housing having a second hollow interior receiving space, the tailpiece and the shoulder rest each receiving sections of electronic circuitry in the respective first hollow interior and the second hollow interior;
    a battery powered amplification unit coupled to the sections of electronic circuitry, the battery powered amplification unit disposed within the second hollow interior of the shoulder rest; and
    one or more controllers coupled to the battery powered amplification unit, wherein the tailpiece further comprises a first controller of the one or more controllers coupled to the battery powered amplification unit, and the shoulder rest further comprises a second controller of the one or more controllers coupled to the battery powered amplification unit.

2. The onboard electronic system of claim 1, wherein the shoulder rest further comprises an output jack electrically coupled between the battery powered amplification unit and a speaker.

3. The onboard electronic system of claim 1, wherein the one or more controllers are selected from one or more of the group consisting of a volume control, a tone control, and a potentiometer.

4. The onboard electronic system of claim 3, wherein the tailpiece further comprises one or more fine tuners.

5. The onboard electronic system of claim 4, further comprising a multi-channel input cable.

6. The onboard electronic system of claim 5, further comprising a blend controller.

7. The onboard electronic system of claim 6, wherein the blend controller in operation modifies a blending of the electrical signals.

8. The onboard electronic system of claim 1, further comprising a chinrest, wherein the chinrest comprises a third housing having a third hollow interior receiving space, the tailpiece, the shoulder rest, and the chinrest each receiving at least a part of the sections of the electronic circuitry disposed within the respective first hollow interior, the second hollow interior, and the third hollow interior.

* * * * *